United States Patent
Wu et al.

(10) Patent No.: US 9,349,662 B2
(45) Date of Patent: May 24, 2016

(54) TEST STRUCTURE PLACEMENT ON A SEMICONDUCTOR WAFER

(71) Applicant: Taiwan Semiconductor Manufacturing Company, Ltd., Hsin-Chu (TW)

(72) Inventors: Chuan-Ling Wu, Changhua County (TW); Cheng-Hsien Chuang, Tainan (TW); Chun-Chang Chen, Tainan (TW); Wang-Pen Mo, Pingtung County (TW); Hung-Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/692,414

(22) Filed: Dec. 3, 2012

(65) Prior Publication Data
US 2014/0151699 A1 Jun. 5, 2014

(51) Int. Cl.
*H01L 21/66* (2006.01)

(52) U.S. Cl.
CPC ............... *H01L 22/30* (2013.01); *H01L 22/34* (2013.01); *H01L 2924/0002* (2013.01)

(58) Field of Classification Search
CPC ..... H01L 22/12; H01L 22/34; H01L 23/5226; H01L 22/00; H01L 22/30; H01L 21/66; H01L 21/58
USPC .............. 257/48, E21.53, E23.002, E23.145; 250/492.1
See application file for complete search history.

(56) References Cited

U.S. PATENT DOCUMENTS

| | | | | |
|---|---|---|---|---|
| 6,061,814 A * | 5/2000 | Sugasawara et al. | ......... | 714/724 |
| 6,433,561 B1 * | 8/2002 | Satya et al. | ................ | 356/237.5 |
| 6,967,111 B1 * | 11/2005 | Hata | ................................ | 438/11 |
| 6,976,111 B1 * | 12/2005 | Mills | ...................... | G01C 21/20 439/377 |
| 7,378,289 B1 * | 5/2008 | Ma et al. | .......................... | 438/14 |
| 2002/0187582 A1 * | 12/2002 | Satya et al. | ..................... | 438/48 |
| 2006/0003551 A1 * | 1/2006 | Mancini | .............. | H01L 21/3065 438/462 |
| 2006/0105475 A1 * | 5/2006 | Ciplickas | ........... | G01R 31/2884 438/14 |
| 2006/0221735 A1 * | 10/2006 | Matsumoto | .......... | G11C 29/006 365/201 |
| 2009/0121321 A1 * | 5/2009 | Miccoli et al. | ................ | 257/618 |

OTHER PUBLICATIONS

Wafer Level Reliability Testing, White Paper, http://www.lricks.com/wlrt.htm downloaded Dec. 3, 2012, 4 pages.

* cited by examiner

*Primary Examiner* — Marc Armand
*Assistant Examiner* — Christina Sylvia
(74) *Attorney, Agent, or Firm* — Haynes and Boone, LLP

(57) ABSTRACT

A method of fabricating integrated circuit devices is provided. The method includes forming a plurality of spaced integrated circuit dies on a semiconductor wafer and forming a dedicated test die on the semiconductor wafer adjacent the plurality of spaced integrated circuit dies, the dedicated test die including a test structure having a first width when viewed in a top view and being operable to generate wafer evaluation data. Further, the method includes forming a scribe line region interposed between the plurality of spaced integrated circuit dies, the scribe line region having a second width defined by a distance between adjacent integrated circuit dies when viewed in a top view, the second width being smaller than the first width, and the scribe line region being free of test structures.

14 Claims, 7 Drawing Sheets

TEST STRUCTURE PLACEMENT ON A SEMICONDUCTOR WAFER

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, in semiconductor technologies, a plurality of photomasks (masks) are formed with predesigned IC patterns. The plurality of masks are used during lithography processes to transfer predesigned IC patterns into a plurality of exposure fields on a semiconductor wafer. That is, once a semiconductor wafer has been fabricated, it contains many copies of the same integrated circuit on a plurality of dies. Traditionally, a fabricated semiconductor wafer undergoes evaluative testing to ensure the integrated circuits are formed correctly and that they operate in a desired manner. This testing may be performed using a plurality of test structures (or process control monitors) formed on the wafer. Because space is at a premium on a production wafer, these test structures are commonly formed in the scribe line region between dies. However, forming test structures in a scribe line region has its drawbacks. For instance, a scribe line region may need to have a certain width to accommodate various test structures, thereby limiting the space on a wafer in which dies may be formed. Thus, although existing approaches have been satisfactory for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
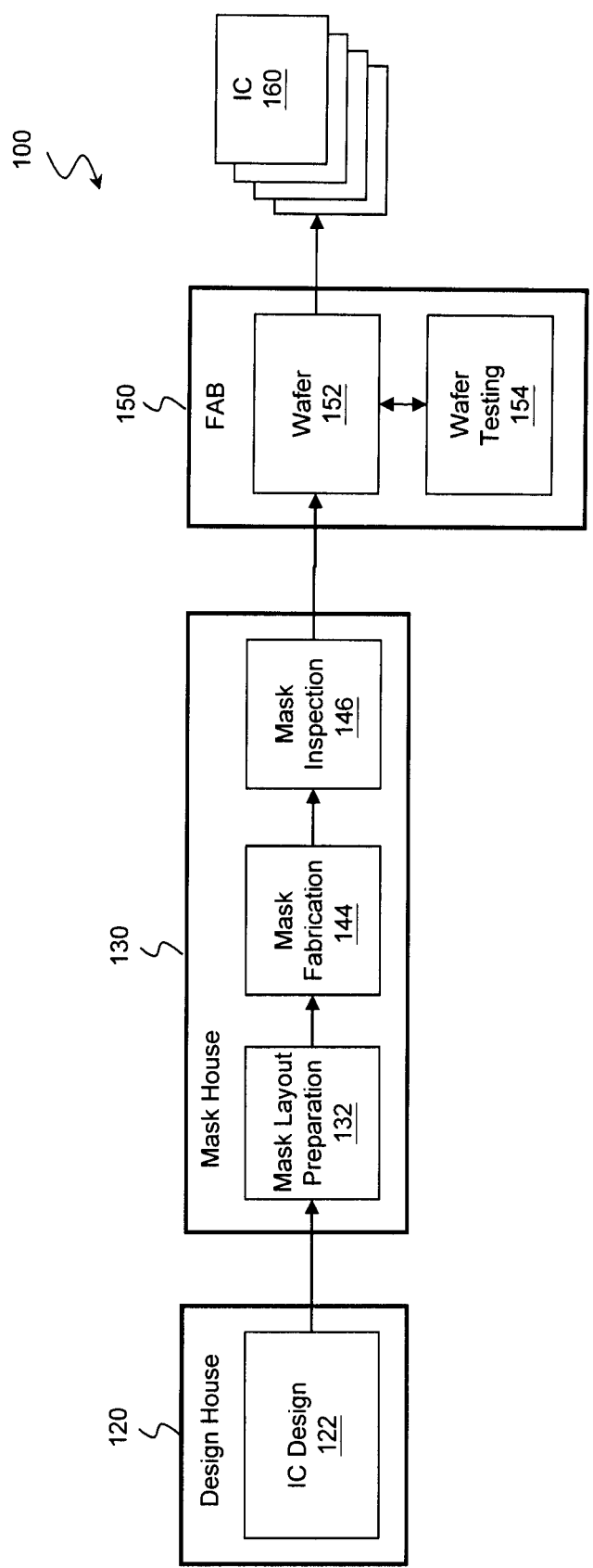
FIG. 1 is a simplified block diagram of an embodiment of an integrated circuit (IC) manufacturing system and an associated IC manufacturing flow.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 120, mask house 130, and IC manufacturer 150 may be a single entity or separate entities.

The design house (or design team) 120 generates an IC design layout 122. The IC design layout 122 includes various geometrical patterns designed for an IC product, based on a specification of the IC product to be manufactured. The geometrical patterns correspond to patterns of metal, oxide, or semiconductor layers that make up the various components of the IC device 160 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format (or DFII file format).

The mask house 130 uses the IC design layout 122 to manufacture one or more masks to be used for fabricating the various layers of the IC product according to the IC design layout 122. The mask house 130 performs mask layout preparation 132, where the IC design layout 122 is translated into a form that can be physically written by a mask writer. Commonly, an IC design may be replicated multiple times on a mask such that when radiation is passed through the mask during photolithography multiple copies of the IC design (or dies) may be formed within a single exposure field (or region) of a semiconductor wafer. As an aspect of this, during mask layout preparation 132, the layout of the mask design may be determined including the location and number of dies to be formed within an exposure field, the location and width of scribe line regions (scribe lanes) around the dies, and the location and type of test structures to be formed on the wafer.

The creation of a mask design layout will be discussed in greater detail in association with FIGS. 3-6.

Additionally, mask layout preparation 132 may include optical proximity correction (OPC) and a lithography process check (LPC) on the IC design layout 122 to compensate for image errors and simulate mask fabrication. The mask house 130 also performs mask fabrication 144, where the design layout prepared by the mask layout preparation 132 is modified to comply with a particular mask writer and/or mask manufacturer and is then fabricated. In the present embodiment, the mask layout preparation 132 and mask fabrication 144 are illustrated as separate elements, however, the mask layout preparation 132 and mask fabrication 144 can be collectively referred to as mask data preparation.

During mask fabrication 144, a mask or group of masks are fabricated based on the mask design layout which incorporates one or more copies of the IC design layout 122 as modified by mask layout preparation 132. For example, an electron-beam (e-beam) or a mechanism of multiple e-beams is used to form a pattern on a mask (photomask or reticle) based on the mask design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

After a mask has been fabricated, the mask house performs a mask inspection 146 to determine if the fabricated mask includes any defects, such as full-height and non-full-height defects. If any defects are detected, the mask may be cleaned or the mask design layout and/or IC design may be modified further depending on the types of defects detected.

It should be understood that the above description of the mask layout preparation 132 has been simplified for the purposes of clarity, and layout preparation may include additional features such as a logic operation (LOP) to modify the IC design layout according to manufacturing rules, a retarget process (RET) to modify the IC design layout to compensate for limitations in lithographic processes used by IC manufacturer 150, and a mask rule check (MRC) to modify the IC design layout to compensate for limitations during mask fabrication 144. Additionally, the processes applied to the IC design layout 122 during mask fabrication 144 and mask inspection 146 may be executed in a variety of different orders and may include a variety of different and/or additional steps.

The IC manufacturer 150, such as a semiconductor foundry, uses the mask (or masks) fabricated by the mask house 130 to fabricate a semiconductor wafer 152 having a plurality of the IC devices 160 thereon. The IC manufacturer 150 is an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, the semiconductor wafer 152 is fabricated using the mask (or masks) to form a plurality of the IC devices 160. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable processes.

After a semiconductor wafer 152 has been fabricated it may be subjected to wafer testing 154 to ensure the integrated circuits formed thereon conform to physical manufacturing specifications and electrical performance specifications. Commonly, test structures (or process control monitors) formed on the wafer during lithography may be utilized to generate test data indicative of the quality of the fabricated semiconductor wafer. Test structures and the placement of test structures on a semiconductor wafer will be discussed in greater detail in association with FIGS. 3-6. After the wafer 152 passes wafer testing 154, it may be diced (or sliced) along scribe lines to separate the IC devices 160 formed thereon. The dicing process can be accomplished by scribing and breaking, by mechanical sawing (e.g., with a dicing saw) or by laser cutting. Following the dicing process, the plurality of IC devises 160 are individually packaged for use in building electronic devices and, in some embodiments, may be subjected to further individual testing.

Figure 2:
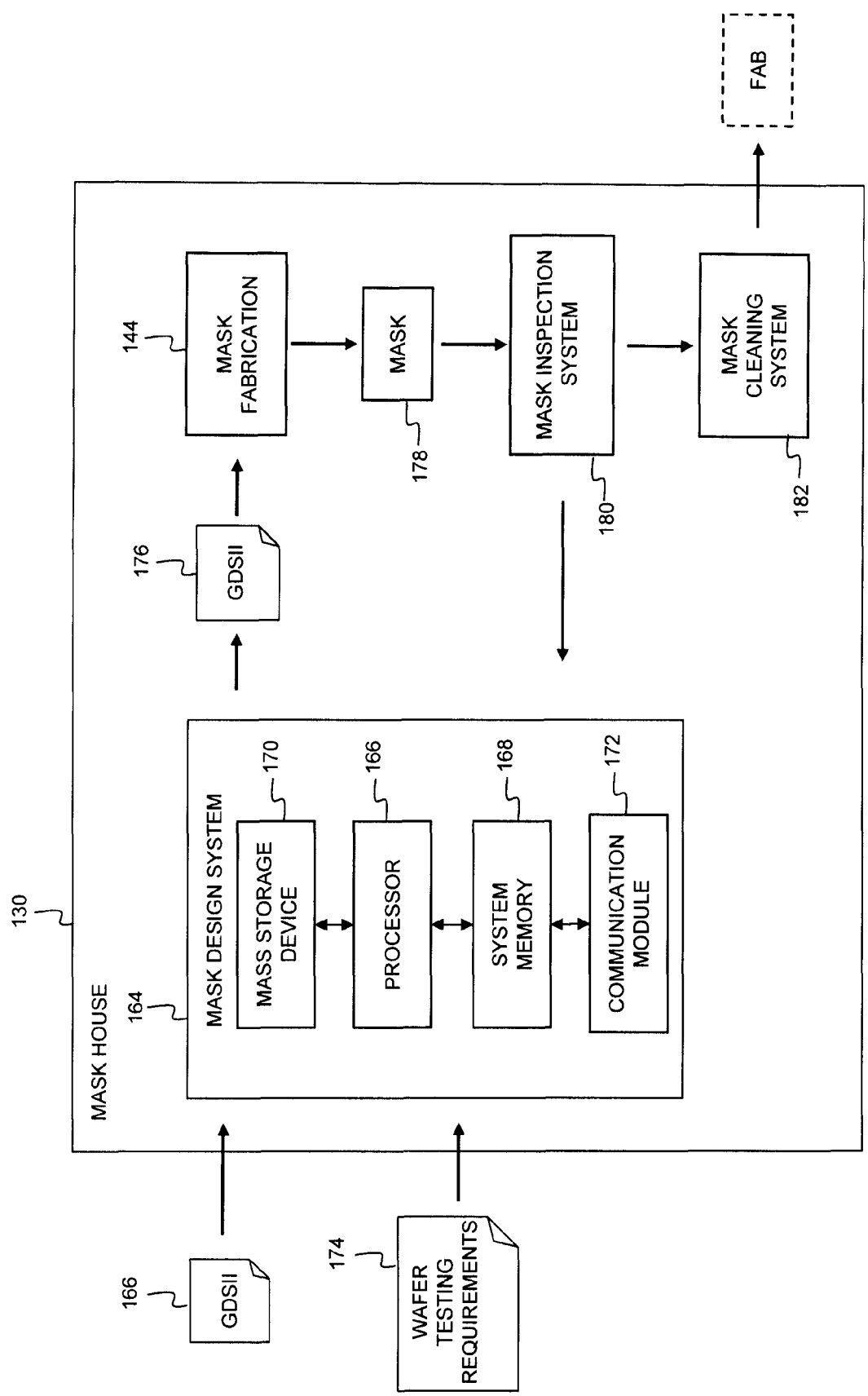
FIG. 2 is a more detailed block diagram of the mask house shown in FIG. 1 according to various aspects of the present disclosure.

FIG. 2 is a more detailed block diagram of the mask house 130 shown in FIG. 1 according to various aspects of the present disclosure. In the illustrated embodiment, the mask house 130 includes various systems that perform the functionality described in association with mask layout preparation 132, mask fabrication 144, and mask inspection 146 of FIG. 1.

In more detail, the mask house 130 includes a mask design system 164 that is generally configured to produce a mask layout design based on the IC design layout 122 from the design house 120. In the illustrated embodiment, the mask design system 164 is an information handling system such as a computer, server, workstation, handheld computing device, or other suitable computing device or collection of communicatively coupled computing devices. The system 164 includes a processor 166 that is communicatively coupled to a system memory 168, a mass storage device 170, and a communication module 172. The system memory 168 provides the processor 166 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 170. Examples of mass storage devices may include hard discs, optical disks, magneto-optical discs, solid-state storage devices, and/or a variety other mass storage devices known in the art. The communication module 172 is operable to receive data such as IC design layout data from local and remote networked systems and communicate information such as finalized mask design data to the other components in the mask house 130. Examples of communication modules may include Ethernet cards, 802.11 WiFi devices, cellular data radios, and/or other suitable devices known in the art.

In more detail, the mask design system 164 accepts as input a first GDSII file 166 containing the IC design layout 122 from the design house 120. The mask design system 164 is configured to perform at least two general functions in the preparation of the mask design layout. First, the mask design system 164 is operable to manipulate the IC design layout 122 according to a variety of design rules and limitations through OPC and LPC so that the fabricated integrated circuits closely conform to the IC design layout. In one embodiment, OPC and LPC may be implemented as software instructions executing on the mask design system 164.

Second, the mask design system 164 is configured to produce a mask design layout that includes all of the features to the formed in an exposure field on a semiconductor wafer. For example, the mask design system is configured to determine the number and arrangement of dies to be formed within an exposure field, the location and width of scribe line regions (scribe lanes) interposed between the dies, and the arrangement and type of test structures to be formed on the wafer. In one embodiment, wafer testing requirements 174 may be input into the wafer design system that determine, in part, the type and placement of any test structures necessary to gather required wafer evaluation data.

As mentioned above, by replicating the IC design layout many times on the mask design layout, multiple dies (integrated circuits) may be formed within a single exposure field. After the dies have been formed on a wafer, the wafer may be sliced along scribe lines within the scribe line regions to separate the dies. The number of dies that may be formed within a single exposure field depends on a number of factors including the size of the die and the width of the scribe line region between each die. To increase yield per wafer without shrinking die size, the width of the scribe line region may be decreased. However, traditionally, test structures are often formed in scribe line regions because space is at a premium within the design of the integrated circuit dies. According to various aspects of the present disclosure, the mask design system 164 may be configured to reduce scribe line region width by moving test structures from the scribe line region to one or more dedicated test dies that are located where one or more standard integrated circuit dies would have been formed. A method of reducing scribe line region width and thus increasing die count is described in more detail in association with FIGS. 3-6.

After the mask design system 164 has formed an appropriate mask design layout, the mask design system transmits a second GDSII file 176 containing the mask design layout to mask fabrication 144. In alternative embodiments, the mask design layout may be transmitted between the components in IC manufacturing system 100 in alternate file formats such as DFII, CIF, OASIS, or any other suitable file type. Mask fabrication 144 produces a mask 178.

The mask house 130 further includes a mask inspection system 180 that is operable to inspect the mask 178 for structural defects. That is, the mask inspection system 180 determines whether the mask 178 conforms to the mask design layout created by the mask design system 164. In various embodiments, the mask inspection system 180 may include an imaging system to scan photomasks at multiple resolutions and produce mask images at the multiple resolutions for inspection. For example, the mask inspection tool 180 may include additional imaging tools such as an optical inspection tool, an electron-beam (e-beam) inspection tool, a scanning probe microscope system, a laser microscope system, a transmission electron microscope system, a focus ion beam microscope system, or other suitable imaging tools. Additionally, the mask inspection system 180 may be configured to identify and classify a variety of defects on the surface of mask 178 as captured in the images produced by the imaging systems.

Depending on the types of defects identified by the mask inspection system 180, the mask 178 may be sent to a mask cleaning system 182 before it is transported to the fab 150, or the mask may be discarded and the defect information may be relayed to the mask design system 164 so that the mask design layout and/or IC design layout may be adjusted. It is understood that the mask house 130 has been simplified for the sake of clarity and the mask design system 164, the mask inspection system 180, and the mask house itself may include additional and/or different components in alternative embodiments.

Figure 3:
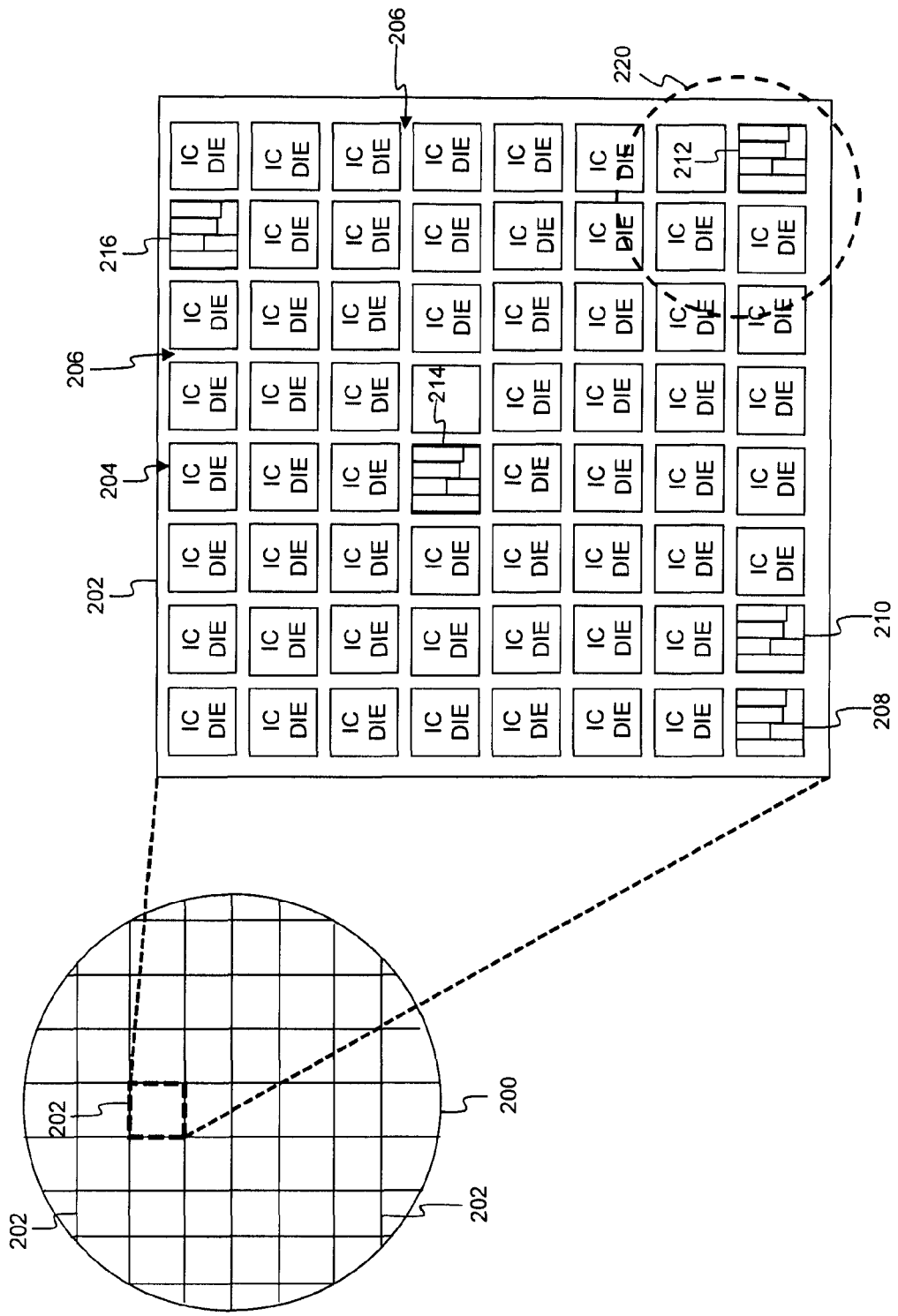
FIG. 3 is a diagrammatic top view of a semiconductor wafer having a plurality of integrated circuit dies formed thereon according to various aspects of the present disclosure.

Referring now to FIG. 3, illustrated is a diagrammatic top view of a semiconductor wafer 200 having a plurality of integrated circuit dies (i.e. devices) formed thereon according to various aspects of the present disclosure. In general, the semiconductor wafer 200 has a higher than normal yield of integrated circuit dies because the scribe line regions between the dies are smaller than traditional scribe line regions due to the absence of test structures in the scribe line regions. In more detail, the semiconductor 200 includes a plurality of exposure fields 202 that have each been exposed by the same photomask. For example, the photomask 178 of FIG. 2 may be utilized in a photolithography process to transfer the design layout of the mask 176 to each of the exposure fields 202. That is, each of the exposure fields 202 include the same pattern of integrated circuits dies. In alternative embodiments, in which relatively large integrated circuits are fabricated, an exposure field may only include a single integrated circuit die.

As indicated by the enlarged portion of semiconductor wafer 200 shown in FIG. 3, the exposure fields 202 include a plurality of die regions 204 separated by a scribe line region 206. The die regions 204 are those regions within the exposure field that include patterned structures formed during fabrication. For example, integrated circuits, test structures, and other patterned structures may be formed within the die regions 204. In the example embodiment of FIG. 3, exposure field 202 includes eight rows of eight die regions each for a total of 64 die regions. A majority of the die regions 204 contain integrated circuit (IC) dies and, as shown in the illustrated example of FIG. 3, some of the die regions contain dedicated test dies. For example, the enlarged exposure field shown in FIG. 3 includes dedicated test dies 208, 210, 212, 214, and 216 and the remainder of die regions 204 include integrated circuit dies formed from an IC design. The dedicated test dies 208, 210, 212, 214, and 216 each have one or more test structures (or frame cells) formed thereon that would normally be disposed within the scribe line region 206. In that regard, the scribe line region 206 is free of test structures. As such, the width of the scribe line region 206 may be smaller than a width of the test structures in the dedicated test dies. Traditionally, the width of a scribe line region on a wafer may have been at least somewhat dependent on the width of test structures intended to be disposed within the scribe line region. In the illustrated embodiment of FIG. 3, the width of the scribe line region 206 is independent of the size of test structures. Though, in certain embodiments, the scribe line width may be dependent on other factors such as the capability of a scribe tool utilized to cut along scribe lines within the scribe line region. The scribe line region 206 will be shown in more detail in FIG. 4. Additionally, in the illustrated embodiment, the dedicated test dies are distinct from the integrated circuit dies such that the dedicated test dies are free of structures that comprise the IC design formed in the integrated circuit dies.

Figure 4:
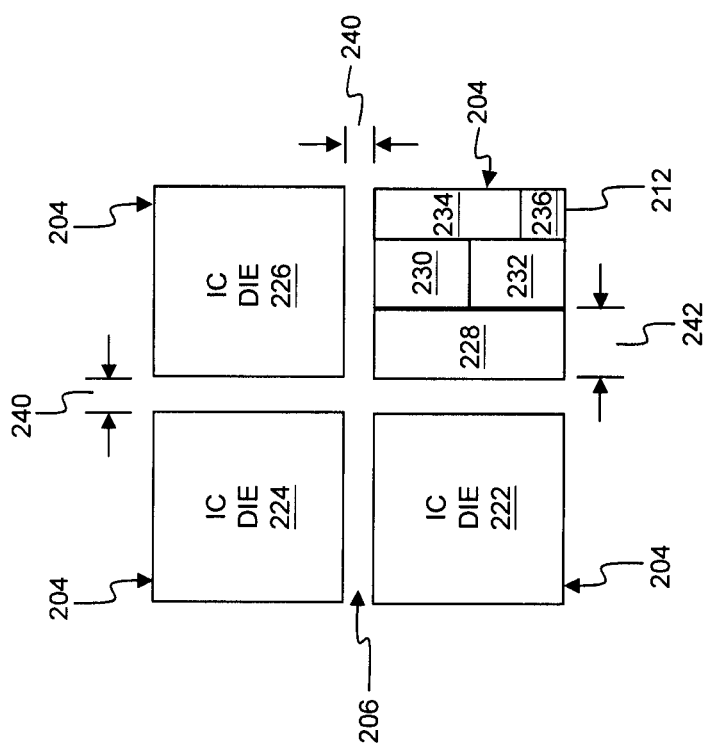
FIG. 4 is an enlarged diagrammatic top view of a portion of the semiconductor wafer of FIG. 3.

In that regard, FIG. 4 is an enlarged diagrammatic top view of a portion 220 of the semiconductor wafer 200 of FIG. 3. FIG. 4 shows four die regions 204 within one of the exposure fields 202 of the wafer 200. Three of the die regions 204 include integrated circuit dies 222, 224, and 226 and the fourth die region includes the dedicated test die 212. The die regions 204 are separated by the scribe line region 206. As illustrated in FIG. 4, the scribe line region 206 is free of test structures such as alignment marks and process control structures. Instead, test structures utilized to generate wafer-level fabrication evaluation data are disposed within the dedicated test die 212. For example, the dedicated test die 212 includes test structures 228, 230, 232, 234, and 236. The test structures formed within the dedicated test die 212 may be any type of test structure, process control monitor, or frame cell that would typically be formed in a scribe line region of a semiconductor wafer. For example, the test structures may be test structures used to evaluate the physical correctness of structures formed on the wafer 200. In particular, the test structures may be overlay alignment marks such as box-in-box patterns, grate-like marks of varying thickness to measure critical dimension, and all-in-one (AIO) monitor patterns with both dense and isolated structures. Further, the test structures on the dedicated test die 212 may be test structures used to evaluate the electrical functionality of the semiconductor wafer 200 (i.e., test structures for in-line parametric testing). For example, the test structures may be dummy transistors or other integrated circuit devices to which electrical currents are applied and measured to evaluate insulator and oxide integrity, leakage current, breakdown voltage, contact resistance, and other electrical characteristics. One of ordinary skill in the art would recognize that additional and/or different test structures may be disposed on the dedicated test structure dies depending on wafer testing requirements.

As shown in FIG. 4, a width 240 of the scribe line region 206 may be defined as the distance between adjacent die regions 204 when viewed in top view. Further, a width 242 of the test structure 228 is defined in FIG. 4. As shown in the illustrated embodiment, the width 242 of the test structure 228 is greater than the width 240 of the scribe line region 206. For example, in a semiconductor technology node of 65 nm, the scribe line region width 240 may be approximately 20 μm and the test structure width may be approximately 60 μm (i.e., the ratio of the width of test structure to the width of the scribe line region is greater than one, and in the particular embodiment of FIG. 4, is approximately 3). In other words, the scribe line region 206 is not wide enough to completely accommodate the test structure 228. As mentioned above, because the scribe line region 206 is relatively small as compared to wafer elements such as test structures, a greater number of integrated circuit dies may be fabricated within an exposure field, and thus on a semiconductor wafer as well. Notably, as the above wafer configuration utilizing dedicated test dies and small scribe line regions is applied to smaller and smaller technology nodes (e.g., the 40 and 28 nm nodes), the IC die yield per wafer may be greater and greater. One of ordinary skill in the art would recognize that the specific dimensions discussed above are simply examples and other scribe line region widths and test structure widths are possible within the 65 nm technology node and other technology nodes. For example, some test structures in the dedicated test die 212 may have a width of approximately 48 μm such as test structure 236, and the width 240 of the scribe line region 206 may be less than 20 μm. In such an embodiment, the ratio of the width of test structure to the width of the scribe line region is at least two.

Figure 7:
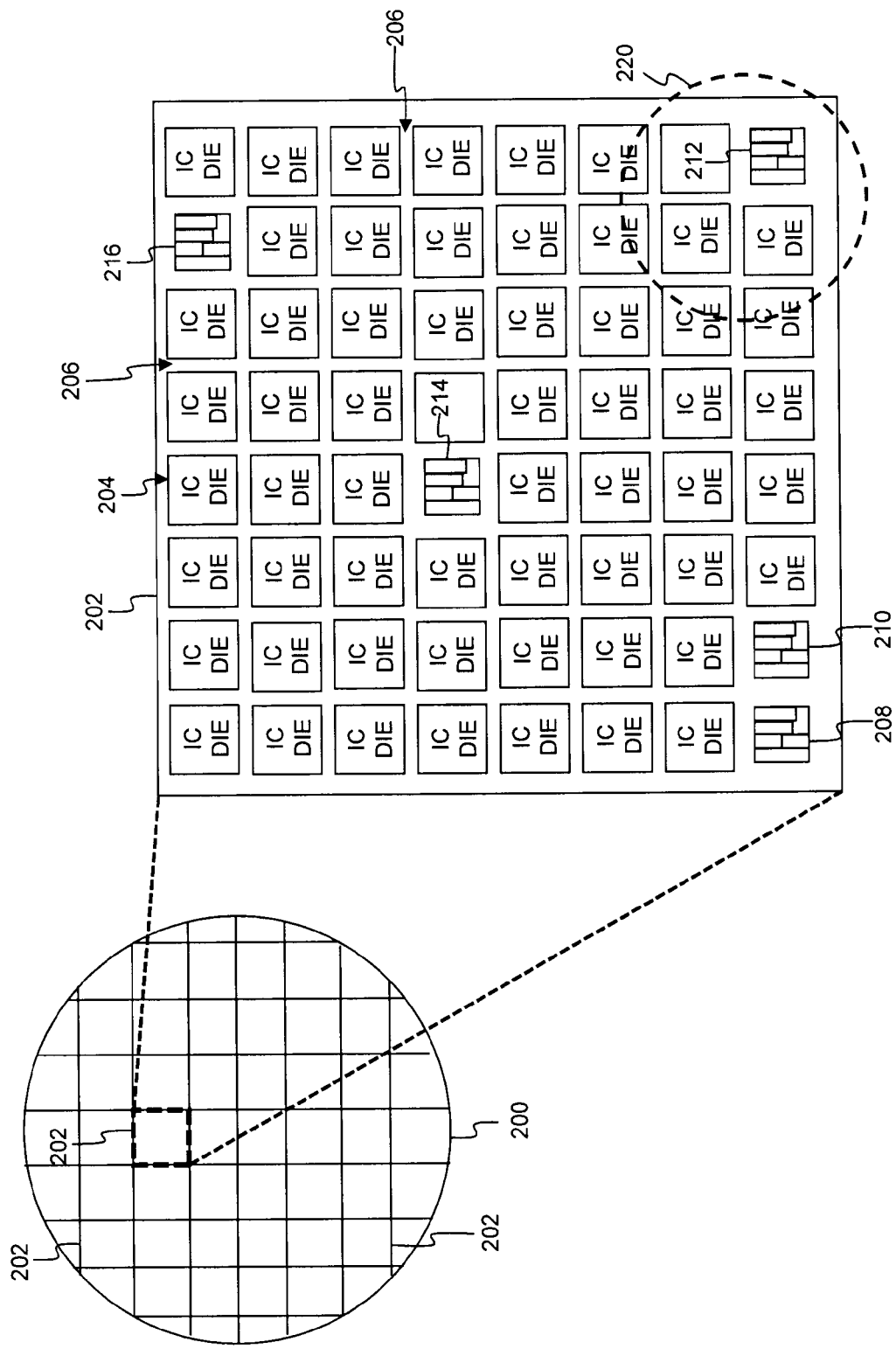
FIG. 7 is a diagrammatic top view of a semiconductor wafer similar to the semiconductor wafer in FIG. 3 and having a plurality of integrated circuit dies formed thereon according to additional aspects of the present disclosure.

Referring back to FIG. 3, a single exposure field, such as the enlarged exposure field 202, may include a plurality of dedicated test dies. In certain embodiments, the number of dedicated test dies is determined by the wafer testing requirements and the number and type of test structures necessary to meet the testing requirements. For example, a relatively large test structure may consume the majority of a dedicated test die and additional test dies may be needed to accommodate additional necessary test structures. Further, in some embodiments, test structures may be divided into portions that are disposed on adjacent dedicated test dies such as test dies 208 and 210. Additionally, in certain embodiments, the dedicated test dies in exposure field (as shown in FIG. 7).

Additionally, dedicated test dies may be strategically placed in various die regions within an exposure field depending on several factors. In the illustrated embodiment of FIG. 3, the die regions 204 are arranged into a square-shaped matrix, and the dedicated test dies such as 208 and 212 are disposed at corner locations within the exposure field 202. Such placement of dedicated test dies may be advantageous because in some fabrication scenarios IC dies located in corner die regions may be more susceptible to fabrication errors. Accordingly, replacing corner IC dies with dedicated test dies may further improve IC die yield. Further, some types of test structures may yield different results when located in different portions of the exposure field. For example, an alignment mark test structure may be included in dedicated test die 208 in the corner of the exposure field as well as included in dedicated test die 214 in approximately the center of the exposure field. As such, alignment mark evaluations from different locations within the exposure field may be compared to evaluate lithography equipment alignment and other variables. Although the die regions 204 are arranged into a square-shaped matrix in the illustrated embodiment, in alternative embodiments, they may be arranged into any number of different formations such as a rectangular matrix or a circular matrix.

Figure 5:
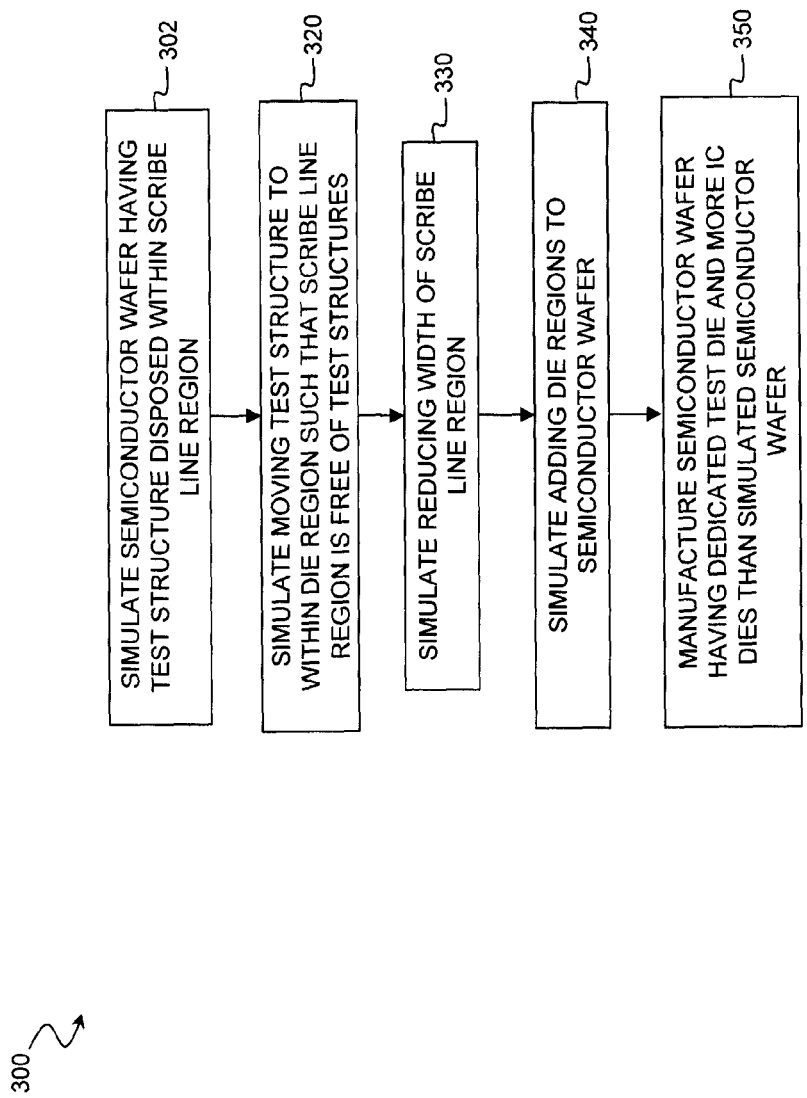
FIG. 5 is a high-level flowchart of a method of designing and fabricating integrated circuit devices on a semiconductor wafer according to various aspects of the present disclosure.

Further, one of ordinary skill in the art would recognize that the semiconductor wafer, exposure field, and IC dies illustrated in FIGS. 4-5 have been simplified for the sake of clarity and each may contain additional and/or different features. For instance, the IC dies may include a guard ring and an input/output pad area disposed between the integrated circuits of the dies and the scribe line region.

Referring now to FIG. 5, illustrated is a high-level flowchart of a method 300 of designing and fabricating integrated circuit devices on a semiconductor wafer according to various aspects of the present disclosure. In the illustrated embodiment, the method 300 is carried out by portions of the integrated circuit (IC) manufacturing system 100 including the mask design system 164 in the mask house 130 shown in FIGS. 1 and 2. Further, in one embodiment, portions of the method 300 may be implemented as computer-readable instructions stored on the mass storage device 170 or system memory 168 and executed by the processor 166 of the mask design system 164. In general, the method 300 produces IC devices using a semiconductor wafer having dedicated test dies and a relatively higher yield of IC dies than conventional semiconductor wafers. Further, the method 300 in FIG. 3 is a high-level overview and details associated with each block in the method will be described in association with subsequent figures in the present disclosure.

The method 300 of designing and fabricating IC devices on a semiconductor wafer begins at block 302 where an initial semiconductor wafer is simulated. In that regard, FIG. 6 includes a diagrammatic top view of an example exposure field 304 in the initial semiconductor wafer simulated in block 302 of method 300. The exposure field 304 includes a plurality of die regions 306 that all have an IC die formed therein. Specifically, the exposure field 304 includes six rows having six die regions each such that the exposure field contains 36 total IC dies. The die regions 306 are separated by a scribe line region 308 having a width 310 in a top view. Further, as shown in the illustrated embodiment, a plurality of test structures 312 are disposed within the scribe line region 308. One such test structure 312 has a width 314 that is smaller than the width 310 of the scribe line region 308.

Figure 6:
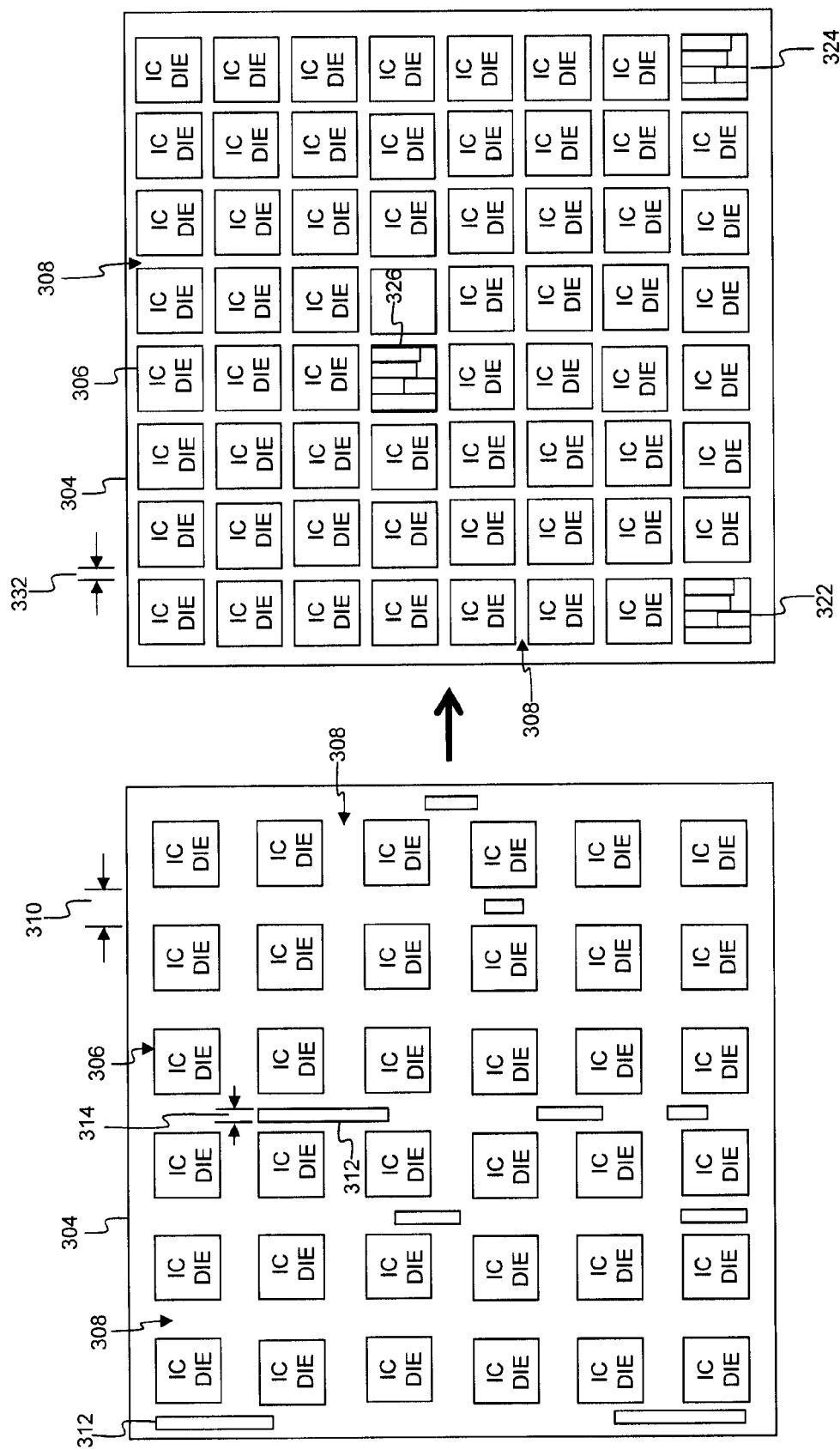
FIG. 6 includes a diagrammatic top view of an example exposure field undergoing the method of designing and fabricating integrated circuit devices on a semiconductor wafer of FIG. 5.

Upon simulation of the initial semiconductor wafer in block 302, the method 300 continues to block 320 where moving the test structures 312 to dedicated test dies within the exposure field 304 is simulated. In more detail, one or more of the IC dies within the die regions 306 are eliminated and replaced with dedicated test dies that have the test structures 312 thereon. In this regard FIG. 6 illustrates the results of simulating moving the test structures 312 to the dedicated test dies 322, 324, and 326. After the moving the test structures 312 to dedicated test dies, the scribe line region 308 is free of test structures.

Referring back to FIG., 5, the method 300 next proceeds to block 330 where reducing the width of scribe line region 308 is simulated. After such reduction, the scribe line region 308 has a width 332 that is smaller than the initial width 310 of the scribe line. Further, the new scribe line region width 332 is smaller than the width 314 of the test structure 312, such that the scribe line region 308 will no longer accommodate the test structure 312. As a result of the scribe line region width being reduced, the die regions 306 are moved closer together and additional space is available in the exposure field 304. The method 300 then continues to block 340 where adding additional die regions 306 to the exposure field 304 is simulated. In particular, a number of additional dies may be added within the space made available by the reduction in the width of the scribe line region 308. As a result, additional IC dies may be formed within these additional die regions. For example, after the addition of die regions and IC dies, the exposure field 304 includes 61 IC dies (i.e., 64 die regions minus three die regions containing dedicated test dies). Accordingly, after moving the test structures 312 to dedicated test dies 322, 324, and 326 and reducing the scribe line region width, the exposure field includes 25 additional IC dies over the initial 36 IC dies simulated in block 302.

Finally, after simulating the addition of IC dies to the exposure field, the method 300 continues to block 350 where the semiconductor wafer with exposure field 304 is manufactured, for example by the IC manufacturer 150 shown in FIG. 1. Notably, the semiconductor wafer manufactured in block 350 includes more IC dies per exposure field than the initial simulated semiconductor wafer formed in block 302 which included test structures disposed in its scribe line region.

It is understood that the method 300 of designing and fabricating IC devices on a semiconductor wafer is simply an example embodiment, and in alternative embodiments, additional and/or different steps may be included in the method.

For example, the simulation and fabrication steps of method 300 may be applied at the semiconductor wafer level such that scribe line regions between exposure fields on a wafer may be reduced by moving any test structures within the scribe line region to dedicated exposure fields. In such an embodiment, a semiconductor wafer fabricated in block 350 may include more exposure fields than an initial wafer simulated in block 302 having test structures disposed in scribe line regions between exposure fields.

Further, in alternative embodiments of method 300, the additional area in an exposure field gained by reducing the width of scribe line regions in block 330 may be utilized in manners other than increasing the number of IC dies formed within the exposure field. For example, in certain embodiments, no additional IC dies may be added but the existing simulated IC dies within an exposure field may be increased in size such that they consume the space previously reserved for the scribe line region. Larger IC dies may accommodate more complex integrated circuits having a greater number of IC components.

Further, portions of the method 300 of designing and fabricating a semiconductor wafer in the illustrated embodiments are designed to be executed on any computing architecture, such as the systems described in association with mask house 130 of FIG. 2. For example, portions of the method 300 may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example. Hardware can include any physical device that is capable of storing machine-readable instructions, such as memory or other data storage devices. Other forms of hardware include hardware sub-systems, including transfer devices such as modems, modem cards, ports, and port cards, for example. Software generally includes any machine code stored in any memory medium, such as RAM or ROM, and machine code stored on other devices (such as floppy disks, flash memory, or a CD-ROM, for example). Software can include source or object code, for example. In addition, software encompasses any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a method of fabricating integrated circuit devices. The method includes forming a plurality of spaced integrated circuit dies on a semiconductor wafer and forming a dedicated test die on the semiconductor wafer adjacent the plurality of spaced integrated circuit dies, the dedicated test die including a test structure having a first width when viewed in a top view and being operable to generate wafer evaluation data. Further, the method includes forming a scribe line region interposed between the plurality of spaced integrated circuit dies, the scribe line region having a second width defined by a distance between adjacent integrated circuit dies when viewed in a top view, the second width being smaller than the first width, and the scribe line region being free of test structures.

In another exemplary aspect, the present disclosure is directed to an apparatus including an integrated circuit device fabricated on a semiconductor wafer. The semiconductor wafer includes a plurality of exposure fields, each exposure field in the plurality of exposure fields having a first number of spaced die regions and a scribe line region, the scribe line region interposed between die regions and having a first width being defined by a distance between adjacent die regions when viewed in a top view. Also, the semiconductor wafer includes a second number of integrated circuit dies formed in respective die regions of each exposure field in the plurality of exposure fields, the second number of integrated circuit dies being less than the first number of die regions. Further, the semiconductor wafer includes a dedicated test die formed in one of the die regions in each exposure field in the plurality of exposure fields, the dedicated test die including a test structure having a second width when viewed in a top view and being operable to generate wafer evaluation data, and the second width of the test structure being greater than the first width of the scribe line region. Additionally, the scribe line region in each exposure field in the plurality of exposure fields is free of test structures.

In yet another exemplary aspect, the present disclosure is directed to a method of fabricating an integrated circuit device. The method includes simulating a semiconductor wafer having an initial number of die regions, a scribe line region interposed between die regions, and a test structure disposed within the scribe line region, the scribe line region having an initial width between die regions in a top view and the test structure having a width in a top view. The method also includes simulating moving the test structure to within one of the die regions, the scribe line region being free of test structures after the simulating moving and simulating reducing the initial width of the scribe line region to a reduced width such that the reduced width is smaller than the width of the test structure after the simulating reducing. Further the method includes simulating adding additional die regions to the semiconductor wafer and manufacturing an integrated circuit device on a physical semiconductor wafer based on the simulated semiconductor wafer. The physical semiconductor wafer including a final number of die regions greater than the initial number of die regions, the test structure formed on a dedicated test die that is disposed within one of the die regions, a plurality of integrated circuit dies formed in respective die regions, and the scribe line having the reduced width.

What claimed is:

1. A method of fabricating integrated circuit devices, comprising:
    forming a plurality of spaced integrated circuit dies on a semiconductor wafer;
    forming a dedicated test die on the semiconductor wafer adjacent the plurality of spaced integrated circuit dies, the dedicated test die including a plurality of independent test structures, each being operable to generate wafer evaluation data; and
    forming a scribe line region interposed between the plurality of spaced integrated circuit dies, the scribe line region having a first width defined by a distance between adjacent integrated circuit dies when viewed in a top view, the first width being smaller than each of the respective widths of the plurality of test structures when viewed in a top view, and the scribe line region being free of test structures;
    wherein the dedicated test die has smaller dimensions in a top view than each of the spaced integrated circuit dies.

2. The method according to claim 1, wherein the wafer evaluation data includes one or more of critical dimension data, alignment data, overlay error data, and electrical characteristic data.

3. The method according to claim 1, wherein forming the dedicated test die includes forming a plurality of dedicated test dies on the semiconductor wafer.

4. The method according to claim 1, wherein forming the plurality of spaced integrated circuit dies includes forming a square-shaped matrix; and wherein forming the dedicated test die includes placing the dedicated test die at a corner of the square-shaped matrix.

5. The method according to claim 1, wherein each side of the dedicated test die is adjacent a different one of the plurality of integrated circuit dies when viewed in a top view.

6. The method according to claim 1, wherein a ratio of each of the respective widths of the plurality of test structures to the first width of the scribe line region is at least two.

7. The method according to claim 1,
    wherein each die of the plurality of spaced integrated circuit dies includes an integrated circuit thereon; and
    wherein the dedicated test die does not include the integrated circuit.

8. A method of fabricating integrated circuit devices, comprising:
    forming a plurality of exposure fields on a wafer, each exposure field in the plurality of exposure fields having a first number of spaced die regions and a scribe line region, the scribe line region interposed between die regions and having a first width being defined by a distance between adjacent die regions when viewed in a top view;
    forming a second number of integrated circuit dies in respective die regions of each exposure field in the plurality of exposure fields, the second number of integrated circuit dies being less than the first number of die regions; and
    forming a dedicated test die in one of the die regions in each exposure field in the plurality of exposure fields, the dedicated test die including a plurality of test structures, each being operable to generate wafer evaluation data, and each of the respective widths of the plurality of test structures being greater than the first width of the scribe line region when viewed in a top view;
wherein the scribe line region in each exposure field in the plurality of exposure fields is free of test structures;
wherein forming the dedicated test die includes:
    forming a plurality of adjacent dedicated test dies on the semiconductor wafer; and
    forming a divided test structure having portions respectively disposed on adjacent dedicated test dies.

9. The method of claim 8, wherein the dedicated test die is one of a plurality of dedicated test dies formed within each exposure field in the plurality of exposure fields.

10. The method of claim 8,
wherein the plurality of spaced integrated circuit dies form a square-shaped matrix; and
wherein the dedicated test die is disposed at a corner of the square-shaped matrix.

11. The method of claim 8, wherein each side of the dedicated test die is adjacent a different one of the plurality of integrated circuit dies when viewed in a top view.

12. The method of claim 8, wherein a ratio of each of the widths of the plurality of test structure to the first width of the scribe line region is at least two.

13. The method of claim 8, wherein the wafer evaluation data includes one or more of critical dimension data, alignment data, overlay error data, and electrical characteristic data.

14. The method of claim 8, wherein each die of the plurality of spaced integrated circuit dies includes an integrated circuit thereon; wherein the dedicated test die does not include the integrated circuit.

* * * * *